US005337461A

United States Patent [19]

Falcus

[11] Patent Number: 5,337,461

[45] Date of Patent: Aug. 16, 1994

[54] LOADING OF FLEXTENSIONAL TRANSDUCER SHELLS

[75] Inventor: Steven J. Falcus, Dorset, England

[73] Assignee: The Secretary of State for Defence in Her Britannic Majesty's Government of the United Kingdom of Great Britain and Northern Ireland, London, England

[21] Appl. No.: 956,011

[22] PCT Filed: Apr. 30, 1991

[86] PCT No.: PCT/GB91/00683

§ 371 Date: Dec. 3, 1992

§ 102(e) Date: Dec. 3, 1992

[87] PCT Pub. No.: WO91/17539

PCT Pub. Date: Nov. 14, 1991

[30] Foreign Application Priority Data

May 9, 1990 [GB] United Kingdom .............. 9010372.2

[51] Int. Cl.[5] .............................................. H01L 41/22

[52] U.S. Cl. ...................................... 29/25.35; 29/450; 310/337; 367/165

[58] Field of Search ............... 29/25.35, 450; 310/337; 367/158, 165

[56] References Cited

U.S. PATENT DOCUMENTS 4,731,764 3/1988 Ponchaud .
4,941,202 7/1990 Upton .
4,970,706 11/1990 Tocquet et al. .

*Primary Examiner*—Carl E. Hall
*Attorney, Agent, or Firm*—Nixon & Vanderhye

[57] ABSTRACT

During assembly of one or more stacks of piezoelectric drive elements along the major axis of the elliptical shell (30) of flextensional transducer the conventional technique is to apply pressure along the minor axis of the shell (30), insert the stacks together with pre-tensioning wedges, and then release the minor axis pressure. The invention provides a method for assembly flextensional transducers by applying pressure uniformly over the entire outer surface of the elliptical shell (30) so as to extend the major axis of the shell (30); inserting and locating the stack(s) within the shell; and removing the pressure. The shell (30) inserted within the enclosure (34) such that access to its interior is available for insertion of the piezoelectric stacks and sliding movement of the shell (30) relative to the enclosure (34) is possible.

5 Claims, 2 Drawing Sheets

LOADING OF FLEXTENSIONAL TRANSDUCER SHELLS

BACKGROUND OF THE INVENTION

1. Field of the Invention

The invention relates to apparatus and method for use in the manufacture of flextensional sonar transducers and in particular to a method for extending the major axis of flexural shells therefor to allow insertion of piezoelectric elements.

2. Discussion of Prior Art

Commonly, flextensional sonar transducers comprise one more stacks of ceramic piezo-electric elements held in compression along the major axis of an elliptical flexural shell made of filament-wound glass, carbon fibres or metal. In operation, electrical signals applied to the piezo-electric elements produce contractions and extensions along the major axis of the flexural shell. These in turn produce larger transverse flexing movements along the minor axis. In use, hydrostatic pressure on the external wall of the elliptical flexural shell reduces the pressure on the transducer stacks along the major axis. Thus, in order to prevent movement the stacks are assembled in the elliptical shell such that a pre-stress is applied along the length of the stacks. This pre-stress is designed to overcome hydrostatic pressure effects corresponding to the maximum pressure depth of the flextensional transducer.

Conventionally during manufacture of flextensional transducers the elliptical shell is made by first winding a resin-coated filament around a mandrel and then the piezo-electric drive elements are inserted along the major axis of the elliptical shell by applying a compressive force on the minor axis of the shell by means of two flat parallel plates to cause an extension along the major axis. The ceramic drive (piezo-electric elements) together with pre-tensioning wedges are then inserted and finally the compressive force on the minor axis is removed.

A major drawback associated with this method has been the occurrence of interlaminar shearing in the composite shell during the compressive stage of ceramic drive assembly. Conventional shell loading has proved particularly unreliable for deep water transducers, requiring large shell compression.

SUMMARY OF THE INVENTION

The object of the invention is to provide apparatus and method for improving the assembly of piezo-electric drive stack(s) within the elliptical flexural shell of a flextensional transducer. The invention provides:

a method of assembling one or more piezo-electric drive stacks along the major axis of the elliptical flexural shell of a flextensional transducer comprising the steps of:

applying pressure uniformly over the entire outer surface of the elliptical shell so as to extend the major axis of the shell;

inserting and locating the stack(s) within the shell; and removing the pressure.

Preferably the method includes the further steps of placing the shell within an enclosure;

sealing the enclosure to the ends of the shell;

filling the space between the enclosure and the outer surface of the shell with fluid; and connecting the enclosure to a pressurizing means whereby fluid pressure can be applied to the outer surface of the shell.

Preferably the fluid is water.

Advantageously an elliptical seal provided with serrations therearound is sealed to each end of the shell.

In a preferred arrangement of the method the enclosure is assembled around the shell by means of the following steps: locating first and second enclosure end-plates against respective elliptical seals for a shell end, at least one of the end plates being provided with an elliptical aperture; providing a cylindrical third enclosure member for pressure-tight assembly between the two end plates so as to form an enclosure defined by the inner surface of the third member, the two end plates and the outer surface of the shell.

BRIEF DESCRIPTION OF THE DRAWINGS

The invention will now be described with reference to the accompanying Drawings of which.

DETAILED DISCUSSION OF PREFERRED EMBODIMENTS

Figure 1:
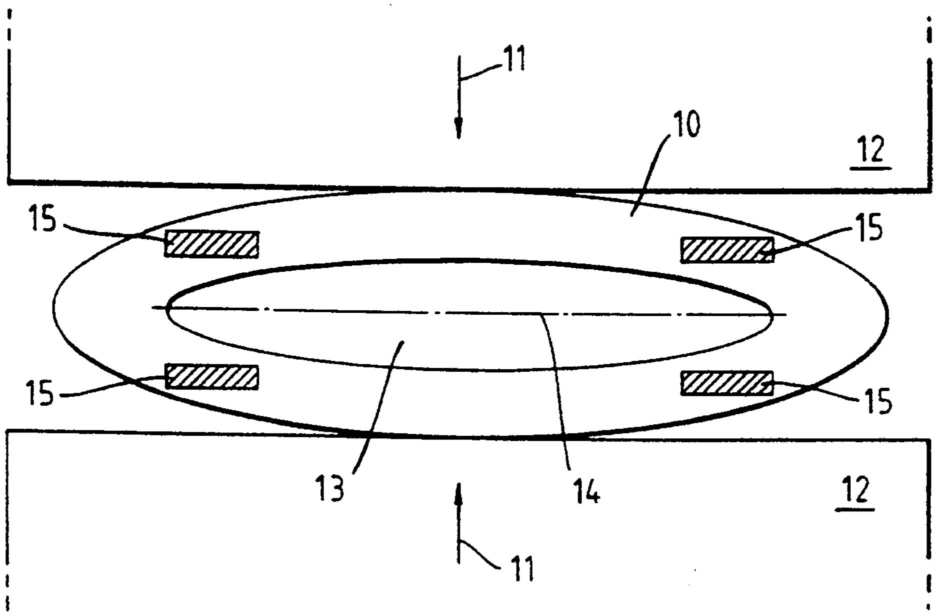
FIG. 1 illustrates a known method for assembling piezo-electric drive stacks in the elliptical shell of a flextensional transducer.

As shown in FIG. 1, a filament-wound elliptical flexural shell 10 for a flextensional transducer is conventionally compressed by point loading 11 applied by a press 12 along the minor axis 13 of the shell. Compression of the minor axis 13 produces an extension of the minor axis 14 which allows one or more stacks of piezo-electric drive elements (not shown) to be inserted along the major axis. On releasing the pressure on the minor axis 13, the shell compresses along the major axis 14 to hold the drive stacks in place.

Point loading of elliptical shells in this manner produces regions 15 of high compressive and tensile forces on the elliptical shell. The prestress which is exerted by the elliptical shell on the drive stacks is, by design, proportional to the pressure depth to which the transducer will be used. Thus the point loading required during assembly, and hence the compressive and tensile forces exerted within the laminations of the elliptical shell, is greatest for the highest pressure depth transducers.

In these composite shell materials, interlaminar shearing has resulted in the regions 15 experiencing high forces and this has proved a major problem in manufacture of flextensional transducers.

Figure 2:
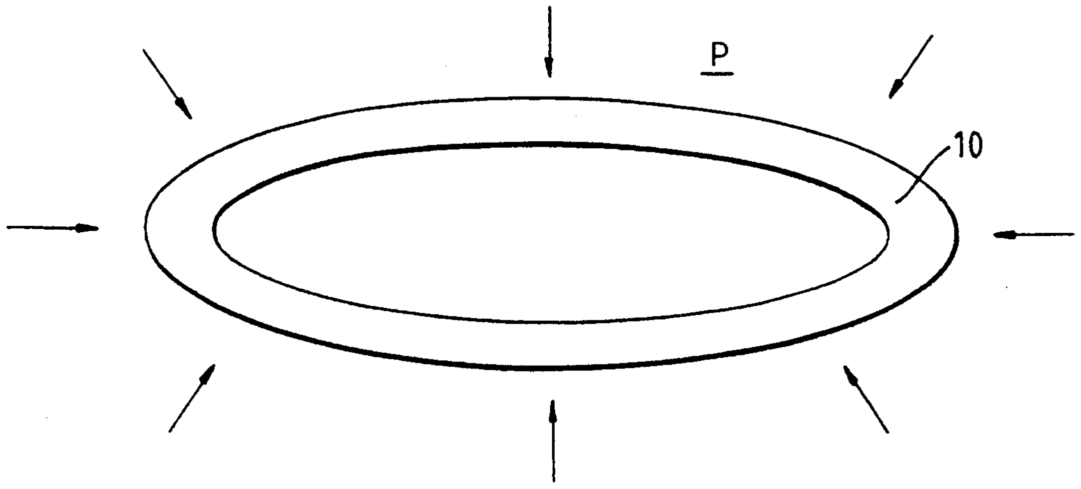
FIG. 2 illustrates a method, according to the present invention, utilising isostatic pressure on the outer surface of the elliptical shell.

FIG. 2 illustrates the principle of the present invention whereby point loading of the elliptical shell during assembly is replaced by uniform hydrostatic pressure applied over the outer surface of the shell. This reduces the compressive and tensile forces in the shell as the load is evenly distributed. This has been found to make interlaminar shearing less likely when loading piezo-electric drive stack(s) into the shell. By this means flextensional transducers can be made which are more durable and which have improved performance.

Figure 3:
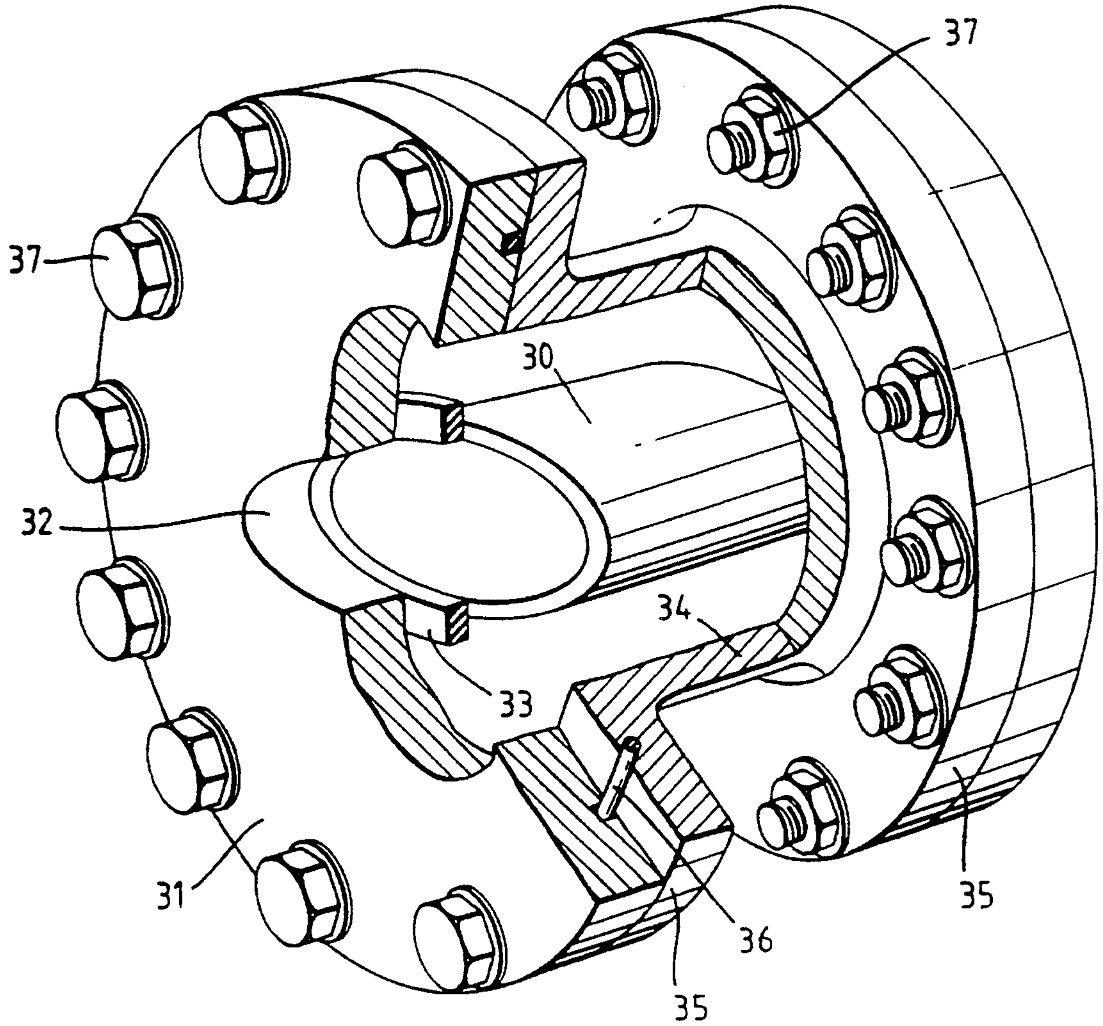
FIG. 3 shows a perspective view, part cut away, of a hydrostatic press for carrying out the assembly of the flextensional transducer.

FIG. 3 shows a hydrostatic press for use in assembling piezo-electric stack(s) within an elliptical shell 30.

The press comprises two flat endplates 31, each with an elliptical aperture 32 corresponding to the opening through the shell 30. A compression seal 33 is provided around the aperture 32 to seal against the adjacent end of the shell 30. The seal 33 is provided with a number of serrated elliptical grooves, tooth-shaped in section, so as to permit some movement of the end of the shell relative to the endplate 31 while maintaining a pressure seal there-between. A cylindrical centre enclosure member 34 surrounds the shell 30 and is provided with flanges 35 for assembly to the endplates 31. An "0" ring 36 is provided in each endplate 31 to seal against the corresponding flange 35 of the cylinder 34. A conduit (not shown) is connected to the press such that pressurised water can be introduced into the enclosure formed around the shell 30. As the pressure is increased the end seals 33 permit extension of the shell 30 along its major axis and then the piezo-electric stack(s) can be introduced through the endplate aperture 32 and assembled inside the shell 30. Bolts 37 are used to hold the press assembly together.

Modifications to the press will be apparent to those skilled in the art and will not therefore be described here.

What is claimed is:

1. A method of assembling one or more piezo-electric drive stacks along the major axis of the elliptical flexural shell of a flextensional transducer, said method including the steps of:

applying pressure uniformly over the entire outer surface of the elliptical shell so as to extend the major axis of the shell;

inserting and locating the stack(s) within the shell during said pressure applying step; and removing the pressure.

2. A method as claimed in claim 1 including the further steps of placing the shell within an enclosure; sealing the enclosure to the ends of the shell while permitting sliding movement of the shell relative to the enclosure; filling the space between the enclosure and the outer surface of the shell with fluid; and connecting the enclosure to a pressurising means whereby fluid pressure can be applied to the outer surface of the shell.

3. A method as claimed in claim 2 wherein the fluid is water.

4. A method as claimed in claim 1 wherein an elliptical seal provided with serrations therearound is sealed to each end of the shell.

5. A method as claimed in claim 4 wherein the enclosure is assembled around the shell by means of the following steps: locating first and second enclosure endplates against respective elliptical seals for a shell end, at least one of the end plates being provided with an elliptical aperture; providing a cylindrical third enclosure member for pressure-tight assembly between the two end plates so as to form an enclosure defined by the inner surface of the third member, two end plates and the outer surface of the shell.

* * * * *